United States Patent
Kim

(10) Patent No.: US 6,207,906 B1
(45) Date of Patent: Mar. 27, 2001

(54) PCB HAVING HOLES BETWEEN TERMINALS AND METHOD OF MAKING THE SAME

(75) Inventor: Ju-Nyun Kim, Kumi (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/185,677

(22) Filed: Nov. 4, 1998

(30) Foreign Application Priority Data

Nov. 6, 1997 (KR) .................................................. 97/58419

(51) Int. Cl.$^7$ ....................................................... H05K 1/16
(52) U.S. Cl. ........................ 174/260; 333/247; 333/202; 333/206; 174/250
(58) Field of Search .................................... 174/250, 260; 361/777, 748, 768, 767, 782, 808, 811; 333/246, 247, 202, 206

(56) References Cited

U.S. PATENT DOCUMENTS

| | | | |
|---|---|---|---|
| 4,004,256 | * | 1/1977 | Duncan .................................. 333/32 |
| 4,357,647 | * | 11/1982 | Hadersbeck et al. ................. 361/782 |
| 5,343,176 | * | 8/1994 | Hasler .................................. 333/204 |
| 5,506,554 | * | 4/1996 | Ala-Kojola ........................... 333/206 |

* cited by examiner

Primary Examiner—Hyung-Sub Sough
Assistant Examiner—Kamand Cuneo
(74) Attorney, Agent, or Firm—Dilworth & Barrese, LLP

(57) ABSTRACT

A printed circuit board (PCB) for mounting a dielectric radio frequency (RF) band pass filter (BPF) thereon, and a method of making the same, is provided. The filter has an input terminal, an output terminal, and a ground terminal including a first, a second, and a third terminal. The PCB includes a first terminal for mounting the input terminal of the RF BPF thereon. A second terminal of the PCB is for mounting the output terminal of the RF BPF thereon. The second terminal is disposed horizontally apart from said first terminal by a predetermined distance. A third terminal of the PCB is for mounting the first terminal of the ground terminal of the RF BPF thereon. The third terminal is disposed between said first and said second terminals. A fourth terminal of the PCB is for mounting the second terminal of the ground terminal of the RF BPF thereon. The fourth terminal is disposed vertically apart from said first terminal by a predetermined distance. A fifth terminal is for mounting the third terminal of the ground terminal of the RF BPF thereon. The fifth terminal is disposed vertically apart from said second terminal by a predetermined distance. First to fourth holes are formed in a PCB thickness direction between the first and third terminals, between the second and third terminals, between the first and fourth terminals, and between the second and fifth terminals.

12 Claims, 6 Drawing Sheets

TOP VIEW

BOTTOM VIEW

US 6,207,906 B1

PCB HAVING HOLES BETWEEN TERMINALS AND METHOD OF MAKING THE SAME

BACKGROUND OF THE INVENTION

1. Field of the Invention

The present invention relates generally to printed circuit boards (PCBs) and, in particular, to a PCB that does not alter the characteristics of a radio frequency (RF) band pass filter (BPF) mounted thereon, and a method for making the same.

2. Description of the Related Art

In general, all the elements of a radio communications system are mounted on a PCB. For example, an RF BPF is separately procured and mounted on the PCB.

FIGS. 1A and 1B are top and bottom perspective views of an RF BPF, respectively, to which the present invention is applied. Here, the RF BPF is a dielectric filter, which is mounted on a PCB as shown in FIG. 2 by soldering. That is, an input terminal (IN) 10, an output terminal (OUT) 20, and three terminals 31, 32, and 33 of a ground terminal (GND) 30 of the BPF are mounted on an IN 40, and OUT 50, and three terminal 61, 62 and 63 of a GND 60 of the PCB, respectively.

When the dielectric RF BPF shown in FIGS. 1A and 1B is mounted on the PCB of FIG. 2, capacitance components exist between the IN 10 and the GND 30, and between the OUT 20 and the GND 30 due to the dielectric constant ϵ of the PCB. As a result, the characteristics of the BPF are altered. Thus, despite designing the BPF to satisfy characteristic requirements for an intended application, the BPF cannot reliably operate when mounted on the PCB (due to e.g., loss increase and changed center frequency).

FIGS. 3 and 4 are Smith charts illustrating the characteristics of the RF BPF when unmounted and mounted, respectively. The BPF characteristics shown in FIG. 3 meet the intended application requirements. However, the characteristics of the BPF become unsatisfactory when the BPF is mounted on the PCB. In the former case (FIG. 3), the impedance of the BPF is at an inductance location of the chart as indicated by wave "A", and the frequency bandwidth is wide as indicated by wave "B". On the other hand, in the latter case (FIG. 4), the impedance of the BPF includes more capacitance components as indicated by wave "A", and the frequency bandwidth becomes narrow as indicated by wave "B". Thus, while it is desirable for the RF BPF to exhibit the characteristics shown in FIG. 3 when the BPF is mounted on the PCB, the characteristics nonetheless change to those shown in FIG. 4. The changes to the characteristics arc attributable to the dielectric constant of the PCB material as described above. While the changes to the characteristics of the BPF can be prevented by re-designing the BPF, a redesign imposes serious constraints on a designer.

SUMMARY OF THE INVENTION

It is an object of the present invention to provide a printed circuit board (PCB) that does not alter the characteristics of a radio frequency (RF) band pass filter (BPF) mounted thereon, and a method for making the same.

It is another object of the present invention to provide a PCB having a dielectric constant that has no influence on the characteristics of an R BPF mounted thereon, and a method for making the same.

It is still another object of the present invention to provide a PCB that does not significantly alter the impedance of an RF BPF mounted thereon, and a method of making the same.

It is a further object of the present invention to provide a PCB that does not narrow the frequency bandwidth of an RF BPF mounted thereon, and a method for making the same.

In one aspect of the invention, a PCB for mounting a dielectric RF BPF thereon, the filter having an input terminal, an output terminal, and a ground terminal including a first, a second, and a third terminal, comprises: a first terminal for mounting the input terminal of the RF BPF thereon; a second terminal for mounting the output terminal of the RF BPF thereon, said second terminal disposed horizontally apart from said first terminal by a predetermined distance; a third terminal for mounting the first terminal of the ground terminal of the RF BPF thereon, said third terminal disposed between said first and said second terminals; a fourth terminal for mounting the second terminal of the ground terminal of the RF BPF thereon, said fourth terminal disposed vertically apart from said first terminal by a predetermined distance; a fifth terminal for mounting the third terminal of the ground terminal of the RF BPF thereon, said fish terminal disposed vertically apart from said second terminal by a predetermined distance; a first hole formed between said first and said third terminals of the PCB in a PCB thickness direction; a second hole between said second and said third terminals of the PCB in the PCB thickness direction; a third hole between said first and said fourth terminals of the PCB in the PCB thickness direction; and a fourth hole between said second and said fifth terminals of the PCB in the PCB thickness direction.

These and other objects, features and advantages of the present invention will become apparent from the following detailed description of illustrative embodiments thereof, which is to be read in connection with the accompanying drawings, where the same reference numerals are used to represent the same functional elements.

DETAILED DESCRIPTION OF THE PREFERRED EMBODIMENT

Figure 1A:
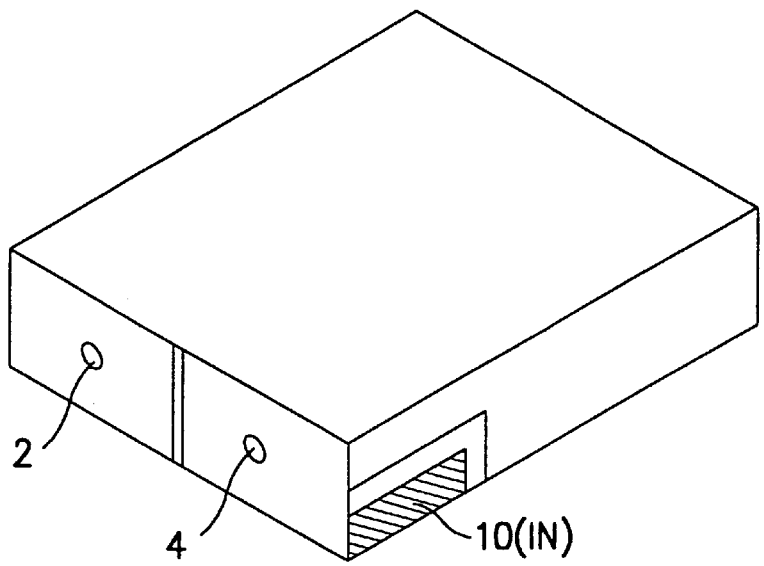
FIGS. 1A and 1B are top and bottom perspective views, respectively, illustrating the outer structure of a radio frequency (RF) band pass filter (BPF) to which the present invention is applied.

A preferred embodiment of the present invention will be described in detail with reference to the accompanying drawings, in which the like reference numerals denote similar or equivalent elements. In the specification, well-known functions or constructions which may unnecessary obscure the invention are not described in detail.

Figure 1B:
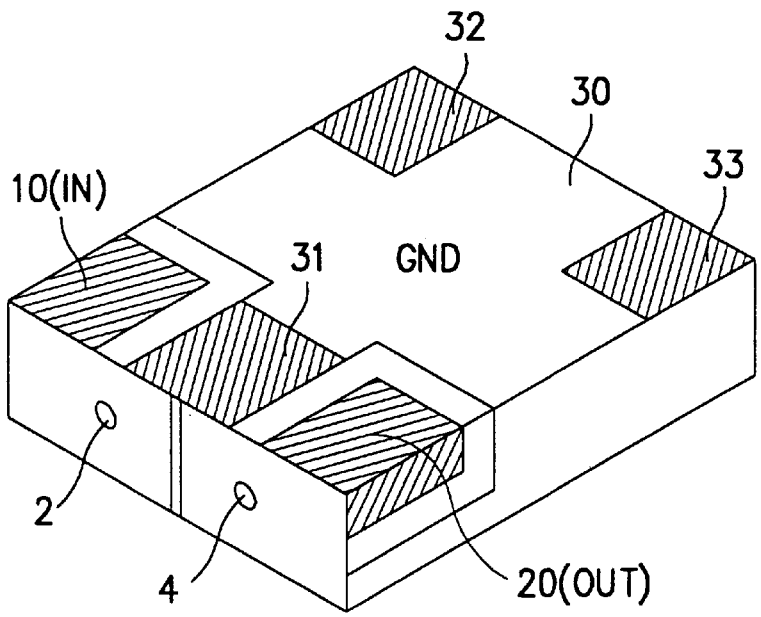
Figure 2:
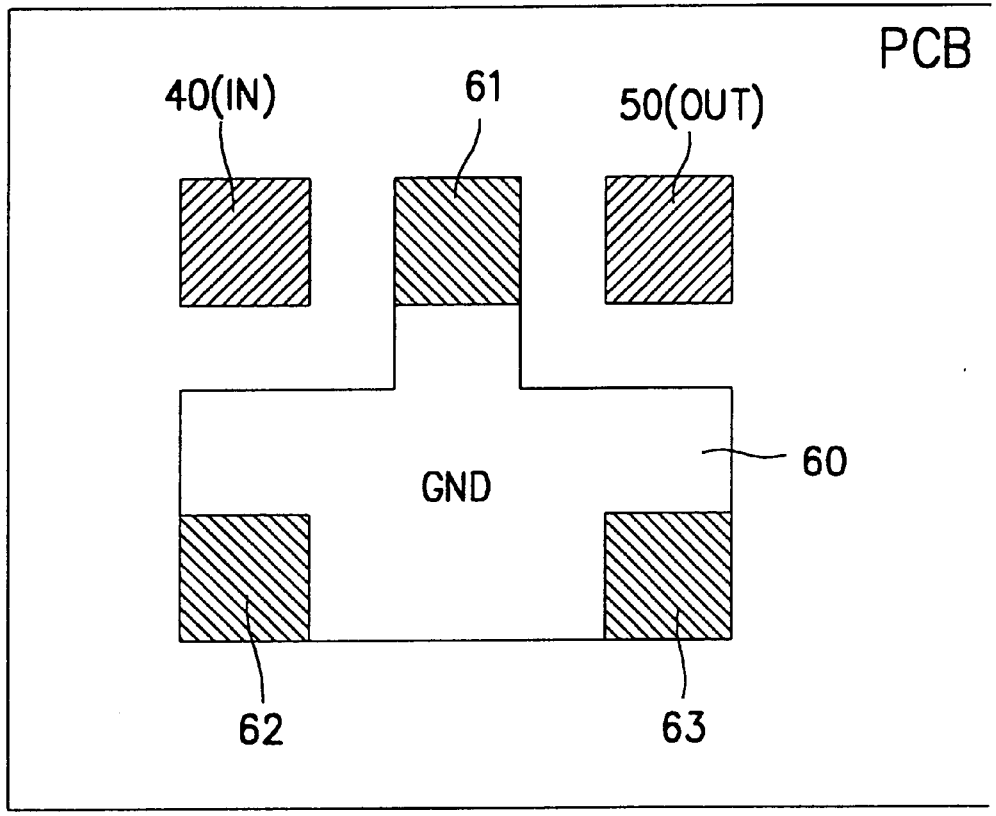
FIG. 2 is a view illustrating a conventional PCB on which the RF BPF of FIGS. 1A and 1B is to be mounted.
Figure 5:
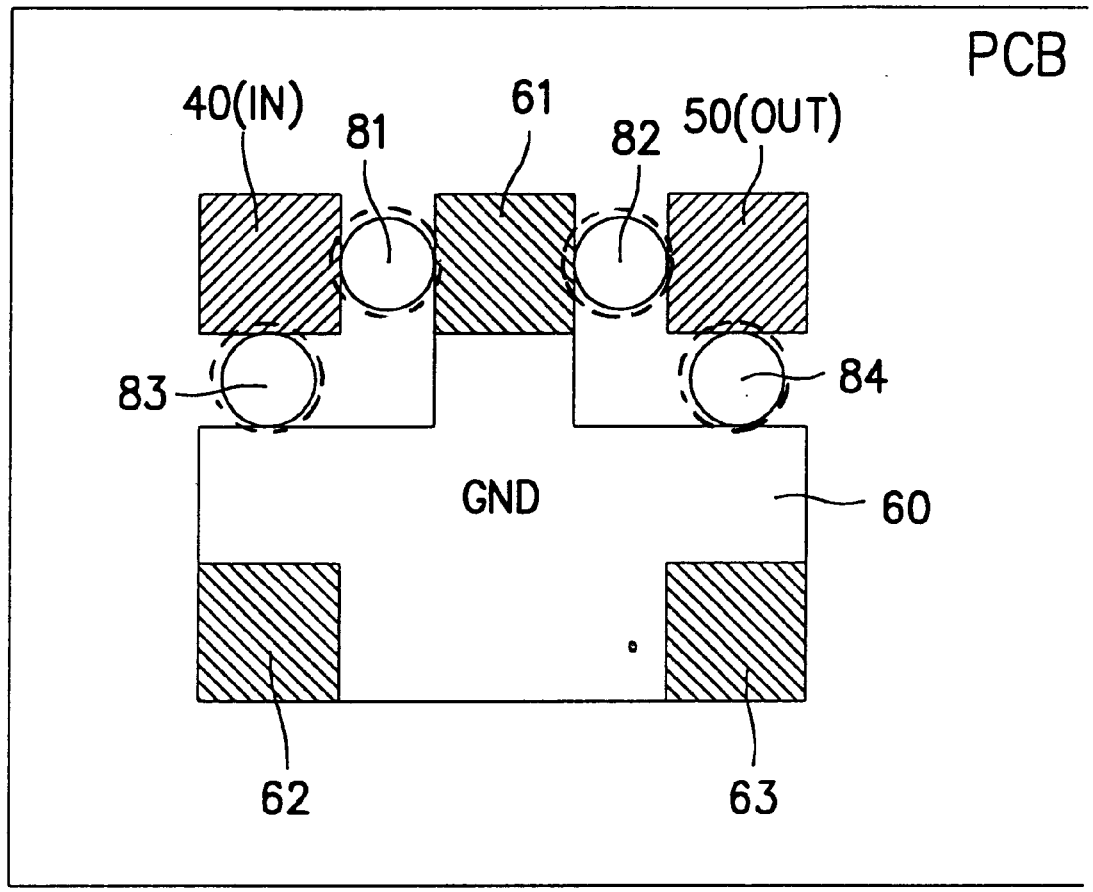
FIG. 5 is a view illustrating a PCB on which the RF BPF of FIGS. 1A and 1B is to be mounted according to the present invention.

FIG. 5 is a view illustrating a printed circuit board (PCB) according to the present invention on which the RF BPF of FIGS. 1A and 1B is to be mounted by soldering. As stated above, the RF BPF includes an input terminal (IN) 10, an output terminal (OUT) 20, and a ground terminal (GND) 30 with three terminals 31, 32, and 33 on the bottom thereof.

The PCB has a first terminal 40 as an input terminal (IN), a second terminal 50 as an output terminal (OUT), and third to fifth terminals 61, 62 and 63 of a GND 60. The IN 10 of the RF BPF is mounted on the first terminal 40 of the PCB. The OUT 20 of the RF BPF is mounted on the second terminal 50 of the PCB apart from the first terminal 40 of the PCB by a predetermined distance in a horizontal direction. The first terminal 31 of the GND 30 is mounted on the third terminal 61 between the first and second terminals 40 and 50. The second terminal 32 of the GND 30 is mounted on the fourth terminal 62 apart from the first terminal 40 by a predetermined distance in a vertical direction. The third terminal 33 of the GND 30 is mounted on the fifth terminal 63 apart from the second terminal 50 by a predetermined distance in a vertical direction.

The PCB of the present invention further includes first to fourth holes 81 to 84 which penetrate through the PCB in a PCB thickness direction. The first hole 81 is disposed between the first and third terminals 40 and 61, the second hole 82 between the second and third terminals 50 and 61, the third hole 83 between the first and fourth terminals 40 and 62, and the fourth hole 84 between the second and fifth terminals 50 and 63. Here, spaces of the same predetermined width are disposed between the first and third terminals 40 and 61 and between the first and fourth terminals 40 and 62. Further, spaces of the same predetermined width are disposed between the second and third terminals 50 and 61 and between the second and fifth terminals 50 and 63. The diameters of the first to fourth holes 81 to 84 are greater than (represented by the dotted lines), or equal to (represented by the solid lines), the widths of their corresponding spaces.

The first to fourth holes 81 to 84 serve to remove capacitance components caused by the dielectric constant of a PCB material from between the first and third terminals 40 and 61, between the second and third terminals 50 and 61, between the first and fourth terminals 40 and 62, and between the second and fifth terminals 50 and 63. Thus, the dielectric constant of the PCB ($\epsilon=4.5$) is replaced by that of air ($\epsilon=1$) between the IN and GND and between the OUT and GND. As a result, the capacitance components caused by the high dielectric constant of the PCB can be minimized.

Figure 6:
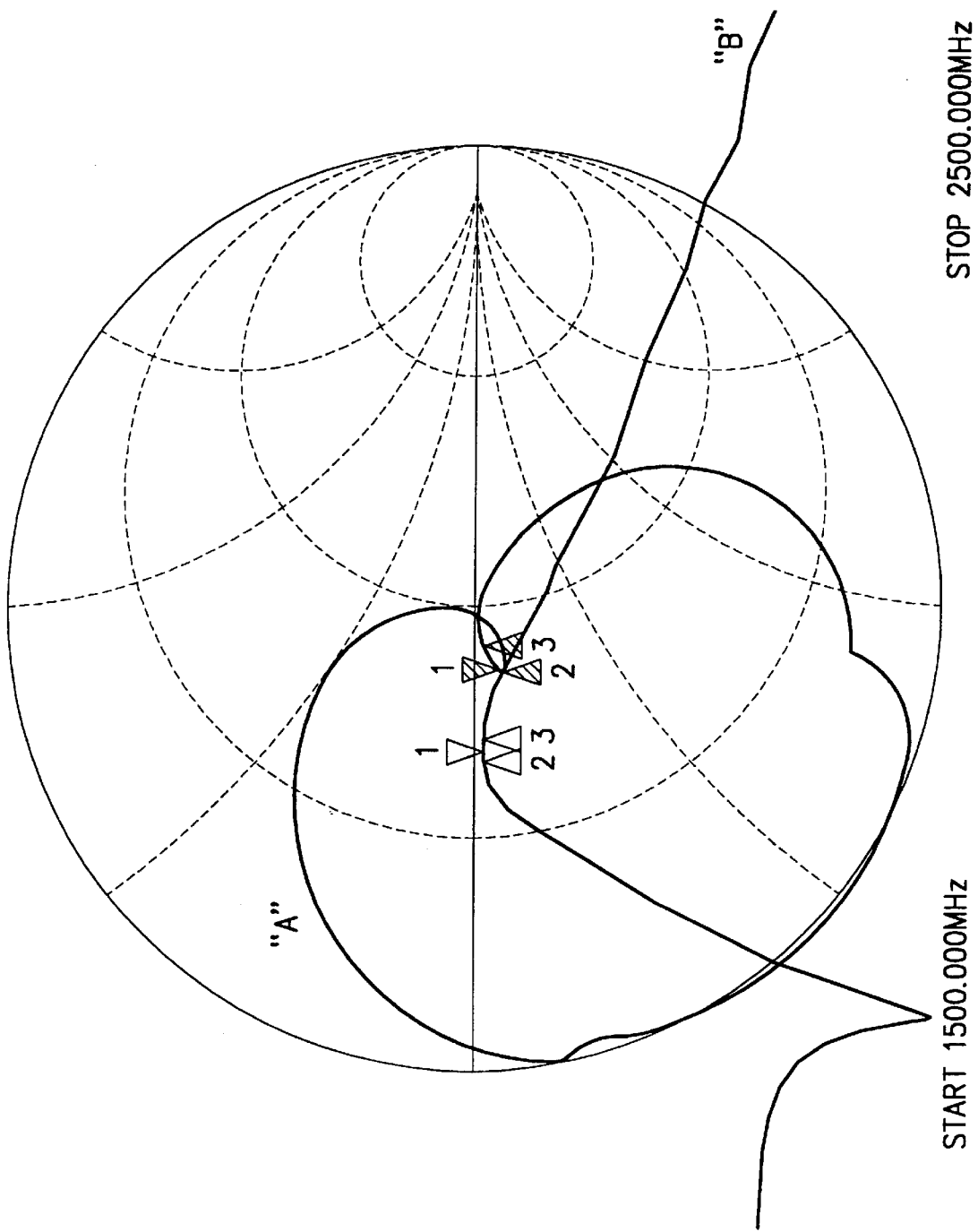
FIG. 6 is a Smith chart showing the characteristics of the RF BPF shown in FIGS. 1A and 1B when it is mounted on the PCB of FIG. 5.

FIG. 6 is a Smith chart illustrating the characteristics of the RF BPF when the RF BPF is mounted on the PCB of FIG. 5. Referring to FIGS. 4 and 6, the impedance of the BPF returns toward the inductance location of the chart as indicated by wave "A", and the frequency bandwidth becomes wide as indicated by wave "B". The following table (Table 1) illustrates the impedance characteristics of the BPF in the following three cases: the RF BPF alone (i.e., unmounted), the RF BPF mounted on a conventional PCB; and the RF BPF mounted on the PCB according to the present invention. The measurements shown in Table 1 are based on the Smith charts of FIGS. 3, 4 and 6.

TABLE 1

|   | RF BPF alone (unmounted) | BPF mounted on conventional PCB | BPF mounted on PCB of present invention |
|---|---|---|---|
| 1 | 40.803Ω, 34.3790Ω | 20.581Ω, −17.9370Ω | 39.506Ω, −3.3867Ω |
| 2 | 69.008Ω, 8,2462Ω | 15.146Ω, −7.1318Ω | 38.754Ω, −4.9453Ω |
| 3 | 46.410Ω, −4.4023Ω | 21.715Ω, −49.324Ω | 42.611Ω, −1.7773Ω |

Figure 3:
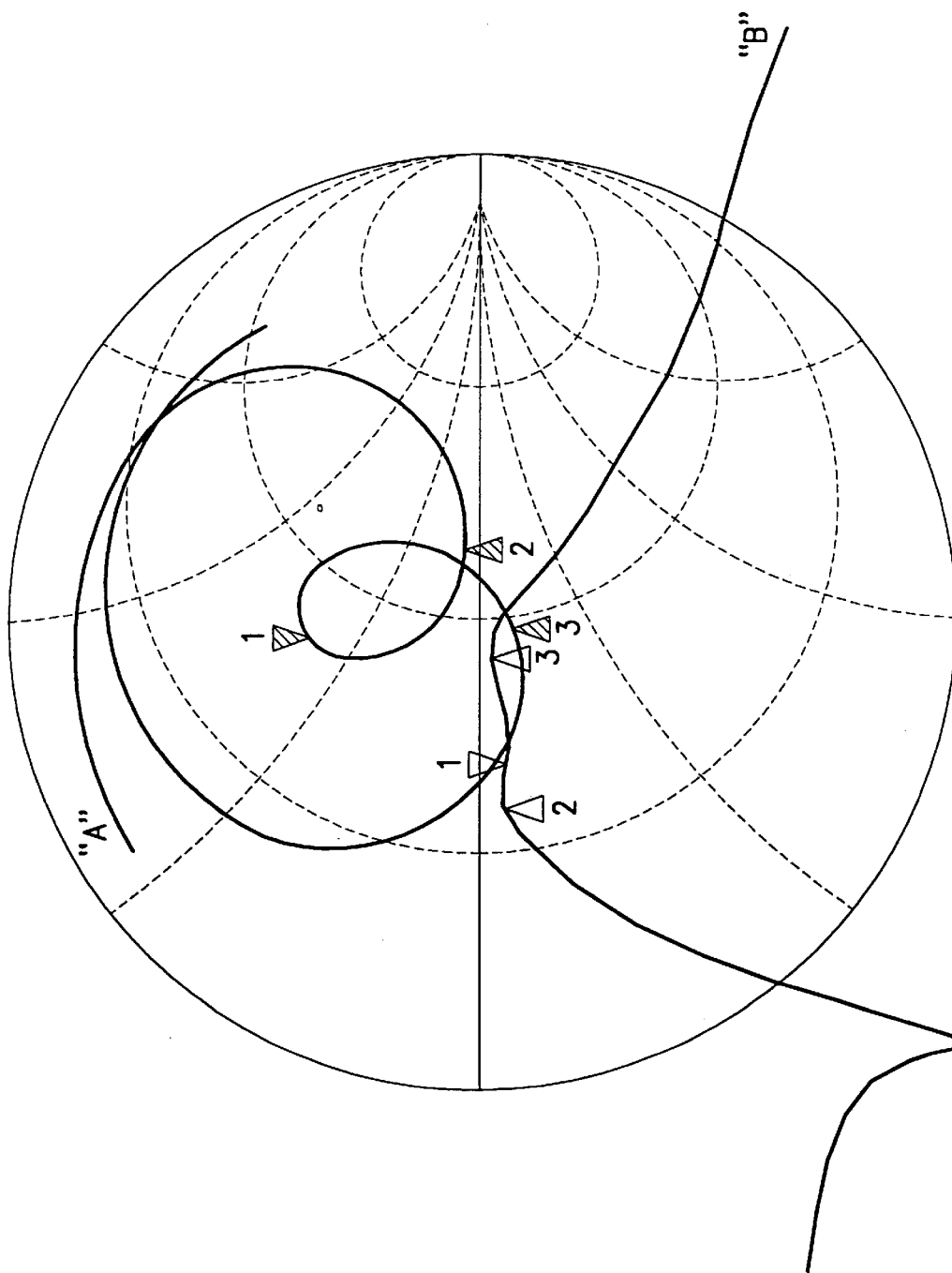
FIG. 3 is a Smith chart illustrating the characteristics of the RF BPF shown in FIGS. 1A and 1B.
Figure 4:
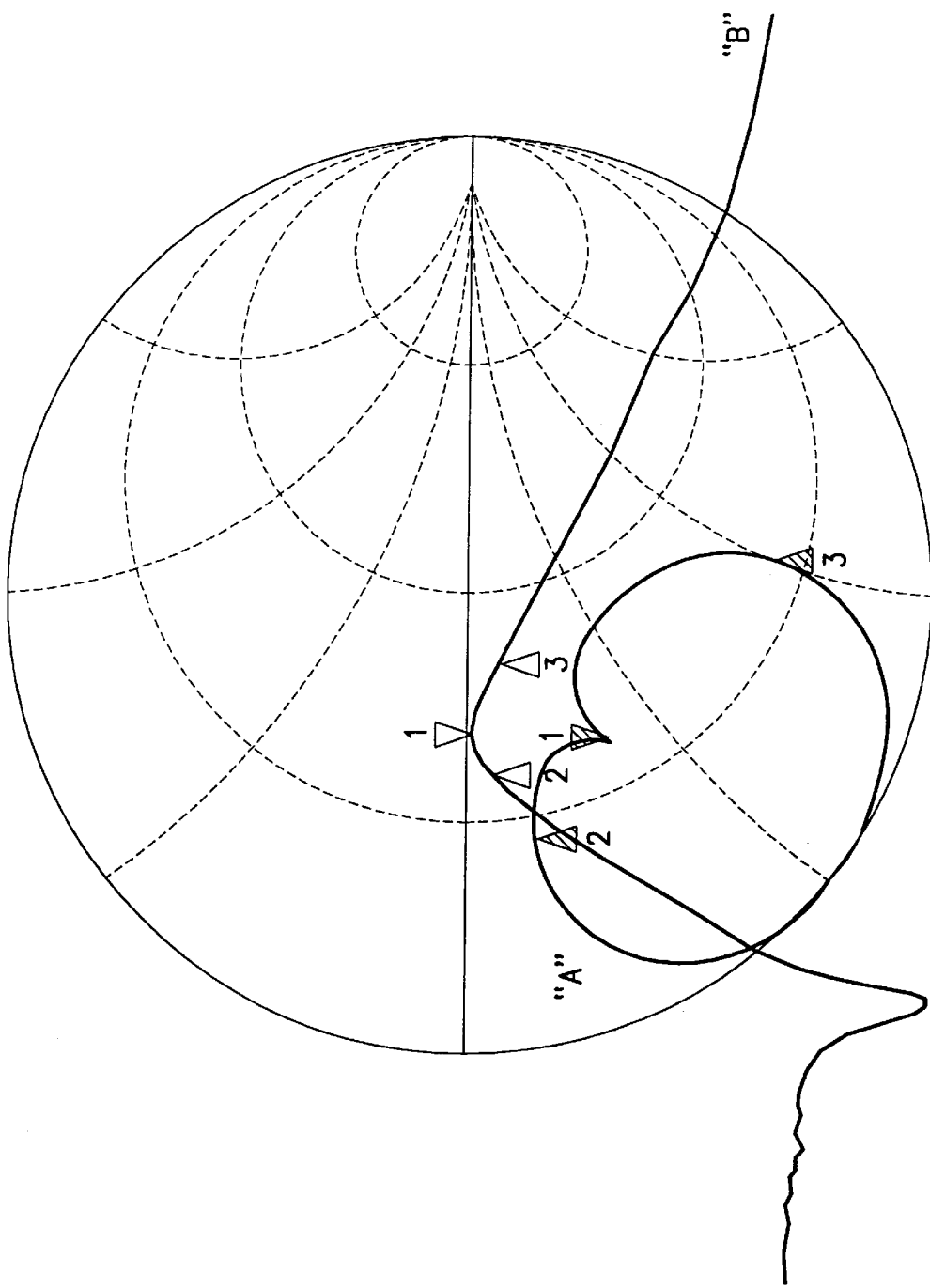
FIG. 4 is a Smith chart illustrating the characteristics of the RF BPF shown in FIGS. 1A and 1B when it is mounted on the PCB.

The numerals 1, 2, and 3 shown in Table 1 correspond to the points 1, 2, and 3 of the "A" waves of FIGS. 3, 4 and 6.

It is to be appreciated that the impedance of the RF BPF includes significantly more capacitance components when the RE BPF is mounted on a conventional PCB (−17.9370, −7.1318, and −49.3240Ω), in comparison to when the RF BPF is mounted on a PCB according to the present invention (−3.3867, −4.9453, and −1.7773Ω). As shown, the impedance of the BPF when mounted on a PCB according to the present invention is similar to that of the BPF by itself (i.e., unmounted).

As described above, capacitance components between an input terminal and a ground terminal, and between an output terminal and the ground terminal of a dielectric BPF are removed when the BPF is mounted on a PCB according to the present invention. That is, the impedance characteristics of the BPF when the BPF mounted on the PCB according to the present invention are approximate to those of the BPF alone (i.e., unmounted). Therefore, additional circuit designing which would otherwise be necessary to return the changed characteristics of the BPF (when mounted on a conventional PCB) to the previous (unmounted) state are not required.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A printed circuit board (PCB) for mounting a dielectric radio frequency (RF) band pass filter (BPF) thereon, the filter having an input terminal, an output terminal, and at least one ground terminal, the PCB comprising:

a first PCB terminal for mounting the input terminal of the RF BPF thereon;

a second PCB terminal for mounting the output terminal of the RF BPF thereon;

at least one PCB ground terminal for mounting the at least one ground terminal of the RF BPF thereon, said at least one PCB ground terminal being disposed between said first and said second PCB terminals; and a plurality of holes formed in the thickness direction of the PCB, wherein a first hole of said plurality of holes is disposed between and extends from said first PCB terminal to said at least one PCB ground terminal and a second hole of said plurality of holes is disposed between and extends from said second PCB terminal to said at least one PCB ground terminal.

2. The PCB of claim 1, wherein said second terminal is disposed horizontally apart from said first terminal by a predetermined distance.

3. The PCB of claim 1, the filter having at least a first, a second, and a third ground terminal, said at least one PCB ground terminal further comprises:

a third terminal for mounting the first terminal of the ground terminal of the RF BPF thereon, said third terminal disposed between said first and said second terminals;

a fourth terminal for mounting the second terminal of the ground terminal of the RF BPF thereon, said fourth terminal disposed vertically apart from said first terminal by a predetermined distance; and a fifth terminal for mounting the third terminal of the ground terminal of the RF BPF thereon, said fifth terminal disposed vertically apart from said second terminal by a predetermined distance, said third, said fourth and said fifth terminals being grounded.

4. The PCB of claim 3, wherein said plurality of holes further comprise:
   a third hole between said first and said fourth terminals of the PCB in the PCB thickness direction; and
   a fourth hole between said second and said fifth terminals of the PCB in the PCB thickness direction.

5. A printed circuit board (PCB) for mounting a dielectric radio frequency (RF) band pass filter (BPF) thereon, the filter having an input terminal, an output terminal, and a ground terminal including a first, a second, and a third terminal, the PCB comprising:
   a first terminal for mounting the input terminal of the RF BPF thereon;
   a second terminal for mounting the output terminal of the RF BPF thereon, said second terminal disposed horizontally apart from said first terminal by a predetermined distance;
   a third terminal for mounting the first terminal of the ground terminal of the RF BPF thereon, said third terminal disposed between said first and said second terminals;
   a fourth terminal for mounting the second terminal of the ground terminal of the RF BPF thereon, said fourth terminal disposed vertically apart from said first terminal by a predetermined distance;
   a fifth terminal for mounting the third terminal of the ground terminal of the RF BPF thereon, said fifth terminal disposed vertically apart from said second terminal by a predetermined distance;
   a first hole formed between said first and said third terminals of the PCB in the PCB thickness direction;
   a second hole between said second and said third terminals of the PCB in the PCB thickness direction;
   a third hole between said first and said fourth terminals of the PCB in the PCB thickness direction; and
   a fourth hole between said second and said fifth terminals of the PCB in the PCB thickness direction.

6. The PCB of claim 5, further comprising a space between said first and said third terminals and a space between said second and said third terminals, wherein said first and said second holes have diameters at least equal to the widths of the corresponding spaces.

7. The PCB of claim 6, further comprising:
   a space formed between said first and said fourth terminals having the same width as the space between said first and said third terminals; and
   a space formed between said second and said fifth terminals having the same width as the space between said second and said third terminals, wherein said third and said fourth holes have diameters at least equal to the widths of the corresponding spaces.

8. A method for making a printed circuit board (PCB) on which a dielectric radio frequency (RF) band pass filter (BPF) is to be mounted, the BPF having an input terminal, an output terminal, and a ground terminal, the method comprising the steps of:
   forming an input terminal, an output terminal, and a ground terminal for respectively mounting the input, output and ground terminal of the RF BPF thereon, said ground terminal being disposed between said input terminal and said output terminals; and
   forming holes into the PCB between the input terminal and the ground terminal and between the output terminal and the ground terminal, in the PCB thickness direction, said holes extending from the input terminal to the ground terminal and from the output terminal to the ground terminal.

9. A method for making a printed circuit board (PCB) on which a dielectric radio frequency (RF) band pass filter (BPF) is to be mounted, the BPF having an input terminal, an output terminal, and a ground terminal between the input and output terminals, the ground terminal including a first, a second, and a third terminal on the bottom thereof, and second terminal vertically spaced from the input terminal, and the third terminal vertically spaced from the output terminal, the method comprising the steps of:
   forming an input terminal and an output terminal horizontally in-line, for respectively mounting the input and output terminals of the RF BPF thereon;
   forming a first terminal for a ground terminal between said input and output terminals of the PCB, apart from said input and output terminals by predetermined distances, a second terminal for the ground terminal vertically spaced from said input terminal, and a third terminal for the ground terminal vertically spaced from said output terminal, for respectively mounting the first, the second, and the third terminals of the ground terminal of the RF BPF thereon; and
   forming four holes into the PCB in the PCB thickness direction, between said input terminal and said first terminal, between said first terminal and said output terminal, between said input terminal and said second terminal, and between said output terminal and said third terminal.

10. A printed circuit board (PCB) for mounting a dielectric radio frequency (RF) band pass filter (BPF) thereon, the filter having an input terminal, an output terminal, and a ground terminal including at least a first, a second, and a third ground terminal, the PCB comprising:
    a first PCB terminal for mounting the input terminal of the RF BPF thereon;
    a second PCB terminal for mounting the output terminal of the RF BPF thereon;
    a third terminal for mounting the first terminal of the ground terminal of the RF BPF thereon, said third terminal disposed between said first and said second terminals;
    a fourth terminal for mounting the second terminal of the ground terminal of the RF BPF thereon, said fourth terminal disposed vertically apart from said first terminal by a predetermined distance; and
    a fifth terminal for mounting the third terminal of the ground terminal of the RF BPF thereon, said fifth terminal disposed vertically apart from said second pin by a predetermined distance, and wherein said third, said fourth and said fifth terminals are grounded; and
    a plurality of holes formed in the thickness direction of the PCB, wherein each of the plurality of holes is disposed between two of said PCB terminals.

11. The PCB according to claim 10, wherein said second terminal is disposed horizontally apart from said first terminal by a predetermined distance.

12. The PCB of claim 10, wherein said plurality of holes comprise:
    a first hole formed between said first and said third terminals of the PCB in the PCB thickness direction;
    a second hole between said second and said third terminals of the PCB in the PCB thickness direction;
    a third hole between said first and said fourth terminals of the PCB in the PCB thickness direction; and a fourth hole between said second and said fifth terminals of the PCB in the PCB thickness direction.

* * * * *